United States Patent
Terzi

(10) Patent No.: US 11,802,042 B2
(45) Date of Patent: Oct. 31, 2023

(54) MEMS ACTUATION DEVICE WITH SPARSE PULSES

(71) Applicant: STMicroelectronics S.r.l., Agrate Brianza (IT)

(72) Inventor: Davide Terzi, Zanica (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 431 days.

(21) Appl. No.: 17/117,469

(22) Filed: Dec. 10, 2020

(65) Prior Publication Data

US 2022/0185658 A1   Jun. 16, 2022

(51) Int. Cl.
    *G02B 26/08*    (2006.01)
    *B81B 7/00*     (2006.01)
    *G02B 7/182*    (2021.01)

(52) U.S. Cl.
    CPC ........... *B81B 7/008* (2013.01); *G02B 7/182* (2013.01); *B81B 2201/042* (2013.01); *G02B 26/08* (2013.01)

(58) Field of Classification Search
    CPC ..... B81B 7/008; B81B 2201/042; B81B 7/02; G02B 7/182; G02B 26/08; G02B 26/0833; H04N 9/3135
    See application file for complete search history.

(56) References Cited

U.S. PATENT DOCUMENTS

| 5,532,468 A | 7/1996 | Scofield |
| 9,612,433 B2 * | 4/2017 | McVittie ............... G02B 26/10 |
| 10,401,616 B2 * | 9/2019 | Haran ................ G02B 26/0833 |
| 2009/0147547 A1 * | 6/2009 | Yamashita ........ H02M 3/33507 363/21.16 |
| 2016/0341955 A1 | 11/2016 | McVittie et al. |
| 2018/0356627 A1 | 12/2018 | Haran |

OTHER PUBLICATIONS

EP Search Report and Written Opinion for family-related EP Appl. No. 21210597.7, report dated May 9, 2022, 10 pgs.

* cited by examiner

*Primary Examiner* — Euncha P Cherry
(74) *Attorney, Agent, or Firm* — CROWE & DUNLEVY

(57) ABSTRACT

A method of operating a MEMS device includes generating a MEMS drive signal, and generating and modifying the MEMS drive signal based upon a control signal to produce a modified drive signal. The method further includes generating the control signal by determining when a feedback signal from the MEMS device is at its peak value, comparing the peak value to a desired value when the feedback signal is as its peak, and generating the control signal depending upon whether the peak value is at least equal to a desired value. The modification of the MEMS drive signal based upon the control signal to produce the modified drive signal includes skipping generation of a next pulse of the modified drive signal when the control signal indicates the peak value is at least equal to the desired value.

16 Claims, 10 Drawing Sheets

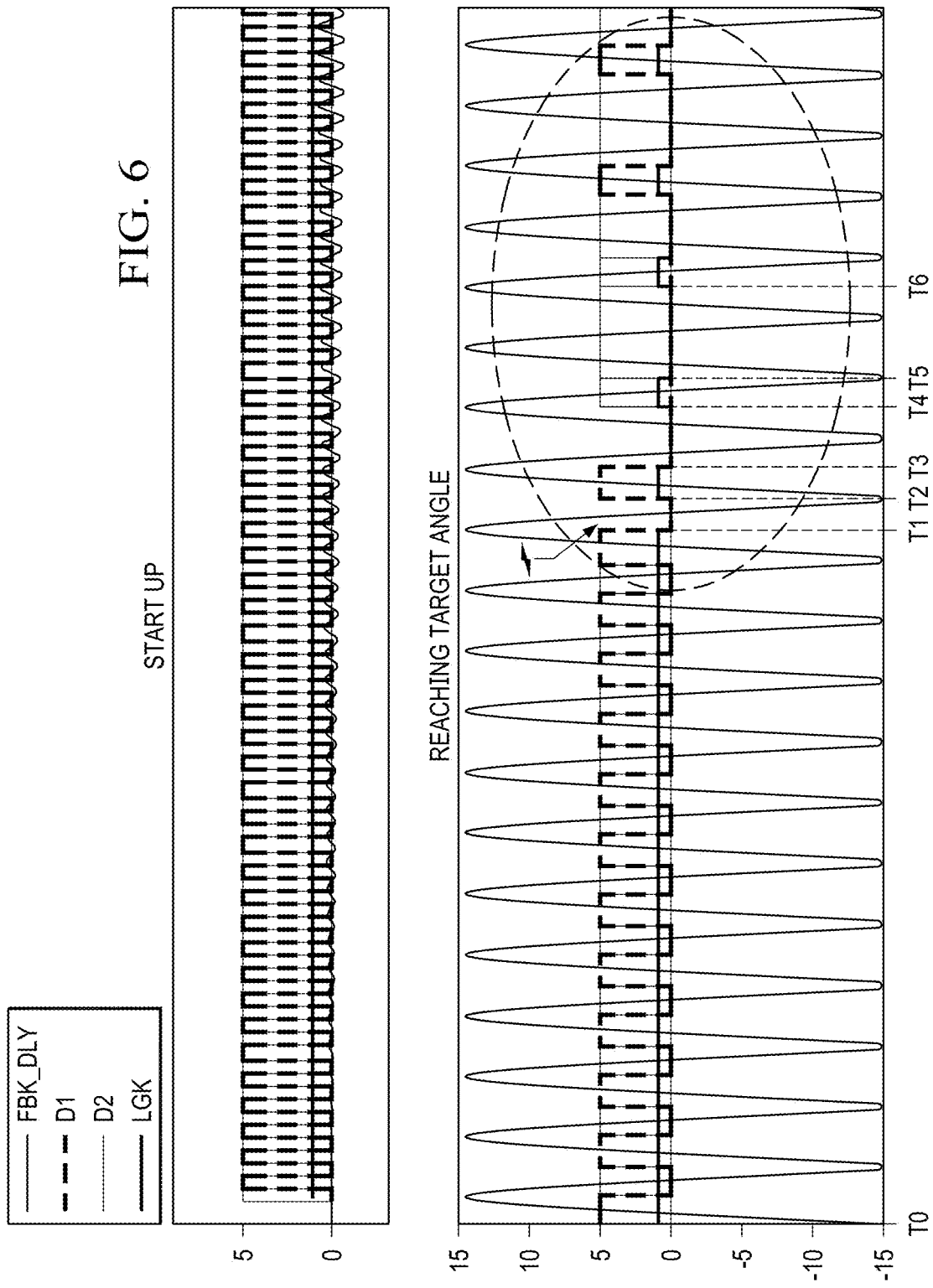

MEMS ACTUATION DEVICE WITH SPARSE PULSES

TECHNICAL FIELD

This disclosure is related to the field of micro-electromechanical systems (MEMS) device actuation using modification of individual drive pulses on a pulse-by-pulse basis to achieve a desired oscillation amplitude with a quicker startup time.

BACKGROUND

Micromachining techniques enable manufacturing of microelectromechanical structures and systems (MEMS) within layers of semiconductor material, which have been deposited or grown on top of sacrificial layers, which are removed via chemical etching. Oscillating micromirrors made with this technology are widely used in laser beam scanning (LBS) modules, which are usable within different small, portable electronic devices to perform, for example, 3D sensing, LIDAR based sensing, or projection. As an example, a scanning projector or "picoprojector" is a small, portable electronic device utilizing such a LBS module. Picoprojectors are typically paired to, or incorporated within, user devices such as smart glasses, smartphones, tablets, laptops, or digital cameras, and used to project virtual and augmented reality, documents, images, or video stored on those user devices onto a projection surface, such as a waveguide, wall, light field, holographic surface, or inner display surface of virtual or augmented reality glasses.

In greater detail, typical LBS modules are comprised of a laser source and one or more MEMS micromirrors to scan the laser beam produced by the laser source across the projection surface in a projection pattern. As an example, in the case where a LBS is used in a picoprojector, by modulating the laser beam according to its position on the projection surface, while the laser beam is scanned in the projection pattern, an image stream is displayed. Commonly, at least one lens focuses the beam before or after reflection by the one or more MEMS micromirrors, and before the laser beam strikes the projection surface, although optical modules of other designs may be used.

The projection subsystem controls the driving of the laser source and the driving of the movement of the one or more MEMS micromirrors, as well as the synchronization of the movement of the one or more MEMS micromirrors with the modulation of the laser source. Typically, the driving of movement of one of the MEMS micromirrors is done so that it oscillates at, or close to, its natural resonance frequency, and the driving of the movement of another of the MEMS micromirrors is done so that it moves following a predetermined trajectory.

MEMS micromirrors driven at resonance are typically driven with a square wave, such as that shown in FIG. 1, where the wave oscillates between the voltages 0 and Vin_max over time. Such MEMS micromirrors are typically equipped with a mirror position sensor, such as a tilt sensor, enabling the sensing of the movement of the MEMS micromirror itself to provide feedback. A typical mirror position sensor provides a sinusoidal output, such as that shown in FIG. 2, where the sine wave indicates mirror position. As shown, when operating properly, such a MEMS micromirror oscillates between maximum $\theta$ max and minimum $\theta$ min angles to define an amplitude, which can be referred to as an opening angle of the MEMS micromirror.

In order to reduce power consumption and increase rejection of vibration noise, MEMS micromirrors may be formed to have a high quality factor (Q-factor). However, high Q-factor MEMS micromirrors take an undesirably long time to reach the desired amplitude at startup, and have a narrow resonant frequency bandwidth, as shown in FIG. 3. In order to operate properly at this narrow resonant frequency bandwidth as it shifts over time, the drive signal (e.g., the square wave) is generated with a high degree of resolution. While this does permit proper operation, such drive signal generation circuitry is complex and consumes an undesirable amount of area, and does not address the issue of startup taking longer than desired. Shown in FIG. 4 is a graph of the amplitude of a high Q-factor MEMS micromirror (with Q being 10,000) at startup, as driven using known techniques, where $F_O$ is the natural resonance frequency of the MEMS micromirror and $F_D$ is the drive frequency of the MEMS micromirror. As can be observed, in order for the amplitude to reach a steady state, the time elapsed is nearly 0.5 seconds, which is far longer than desired in certain applications, such as virtual reality, augmented reality, and mixed reality. In fact, in some cases, this time for the amplitude to reach a steady state can be even longer than 0.5 seconds.

As such, further development into the driving of high Q-factor MEMS micromirrors is needed.

SUMMARY

Described herein is a control circuit for a micro-electromechanical systems (MEMS) device, the control circuit including: an input logic circuit configured to receive at least one MEMS drive signal and a control signal, and cause generation of at least one modified drive signal based thereupon, the at least one modified drive signal being used to drive the MEMS device; and logic circuitry. The logic circuitry is configured to: receive a feedback signal from the MEMS device, and indicate when the feedback signal is at its peak value, the feedback signal being indicative of movement of the MEMS device; and based upon the indication of when the feedback signal is at its peak value, generate the control signal based upon whether the peak value is at least equal to a desired peak value, the desired peak value being indicative of the movement of the MEMS device reaching a desired amplitude. The input logic circuit is configured to modify the at least one MEMS drive signal when the feedback signal is at least equal to the desired peak value to produce the at least one modified drive signal, the modification to the at least one MEMS drive signal rendering the at least one modified drive signal as having a variable frequency and/or duty cycle dependent upon the control signal.

The logic circuitry may include an analog to digital converter that digitizes the feedback signal when the logic circuitry indicates that the feedback signal is at its peak value, and a comparator that compares the digitized feedback signal to the desired peak value to generate the control signal.

The comparator may assert its output when the digitized feedback signal is less than the desired peak value, and deassert its output otherwise. The input logic circuit may include at least one AND gate receiving as input the control signal and the at least one MEMS drive signal, the AND gate generating the at least one modified drive signal as a result of a logical AND operation performed on the control signal and the at least one MEMS drive signal.

A buffer may be coupled between output of the at least one AND gate and the MEMS device.

The comparator may assert its output when the digitized feedback signal is less than the desired peak value, and deassert its output otherwise. The at least one MEMS drive signal may include first and second MEMS drive signals opposite in phase to one another. The at least one modified drive signal may include first and second modified drive signals used to drive the MEMS device. The input logic circuit mat include: a first AND gate receiving as input the control signal and the first MEMS drive signal, the first AND gate generating the first modified drive signal as a result of a logical AND operation performed on the control signal and the first MEMS drive signal; and a second AND gate receiving as input the control signal and the second MEMS drive signal, the second AND gate generating the second modified drive signal as a result of a logical AND operation performed on the control signal and the second MEMS drive signal.

A first buffer may be coupled between output of the first AND gate and the MEMS device, and a second buffer may be coupled between output of the second AND gate and the MEMS device.

A drive clock generator may be configured to generate a drive frequency signal, and a drive clock generator may be configured to generate the at least one MEMS drive signal based upon the drive frequency signal.

A phase delay circuit may be configured to receive the feedback signal, and apply a phase delay to the feedback signal. A phase evaluation circuit may be configured to receive the feedback signal after application of the phase delay thereto by the phase delay circuit, to receive the at least one MEMS drive signal, and to generate a phase evaluation signal indicative of whether the feedback signal leads or lags the at least one MEMS drive signal. A group delay evaluation circuit may be configured to receive the phase evaluation signal, to determine, taking into account system phase delay, whether the MEMS device is operating at resonance, and to generate an output signal based upon the determination. A resonance proportional-integral-derivative loop may be configured to operate based upon the output signal from the group delay evaluation circuit to generate a drive frequency input. The drive clock generator may be configured to generate the drive frequency signal based upon the drive frequency input.

The input logic circuit may modify the at least one MEMS drive signal when the feedback signal is at least equal to the desired peak value by blocking generation of the at least one modified drive signal until the feedback signal is less than the desired peak value.

The input logic circuit may modify the at least one MEMS drive signal when the feedback signal is at least equal to the desired peak value by shortening a pulse width if the at least one modified drive signal until the feedback signal is less than the desired peak value.

The MEMS device may include a MEMS micromirror driven by the at least one modified drive signal, and a position sensor associated with the MEMS micromirror and generating the feedback signal.

The input logic circuit may modify the at least one modified drive signal by inverting the modified drive signal when the feedback signal is at least equal to the desired peak value.

The logic circuitry may include: a peak evaluation circuit configured to receive the feedback signal from the MEMS device, and to indicate when the feedback signal is at its peak value, the feedback signal being indicative of movement of the MEMS device; and a logic core configured to receive the indication from the peak evaluation circuit of when the feedback signal is at its peak value, and generate the control signal based upon whether the peak value is at least equal to a desired peak value, the desired peak value being indicative of the movement of the MEMS device reaching a desired amplitude.

Also disclosed herein is a method of operating a MEMS device. The method includes: generating at least one MEMS drive signal; generating and modifying the at least one MEMS drive signal based upon a control signal to produce at least one modified drive signal; and generating the control signal by determining when a feedback signal from the MEMS device is at its peak value, comparing the peak value to a desired value when the feedback signal is as its peak, and generating the control signal depending upon whether the peak value is at least equal to a desired value. The modification of the at least one MEMS drive signal based upon the control signal to produce the at least one modified drive signal may be performed by skipping generation of a next pulse of the at least one modified drive signal when the control signal indicates the peak value is at least equal to the desired value.

The control signal may be asserted when the peak value is at least equal to a desired value, and the modification of the at least one MEMS drive signal may be accomplished by performing a logical AND operation between the control signal and the at least one MEMS drive signal.

The at least one modified drive signal may be generated by, at least some of the time, inverting the modified drive signal when the feedback signal is at least equal to the desired value.

BRIEF DESCRIPTION OF THE DRAWINGS

FIG. 6 is a graph of different signals of the driving circuit during operation.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
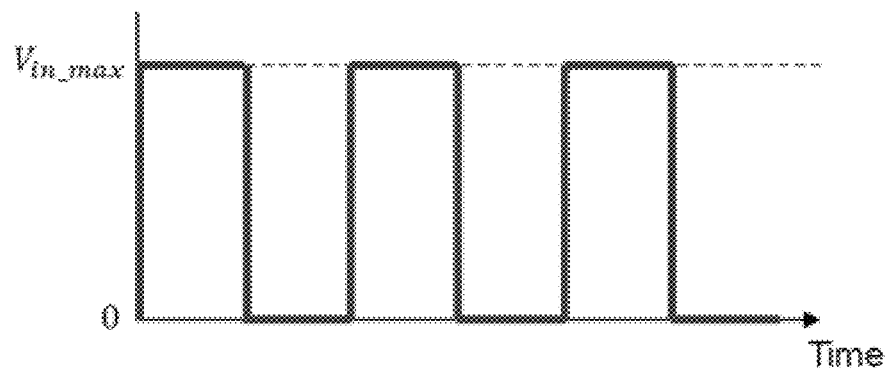
FIG. 1 is a graph of a prior art drive signal for a MEMS micromirror.
Figure 2:
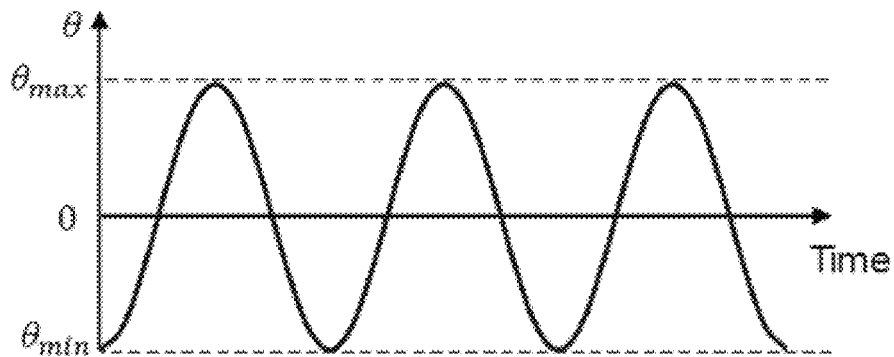
FIG. 2 is a graph of the opening angle of a MEMS micromirror when operated using the prior art drive signal.
Figure 3:
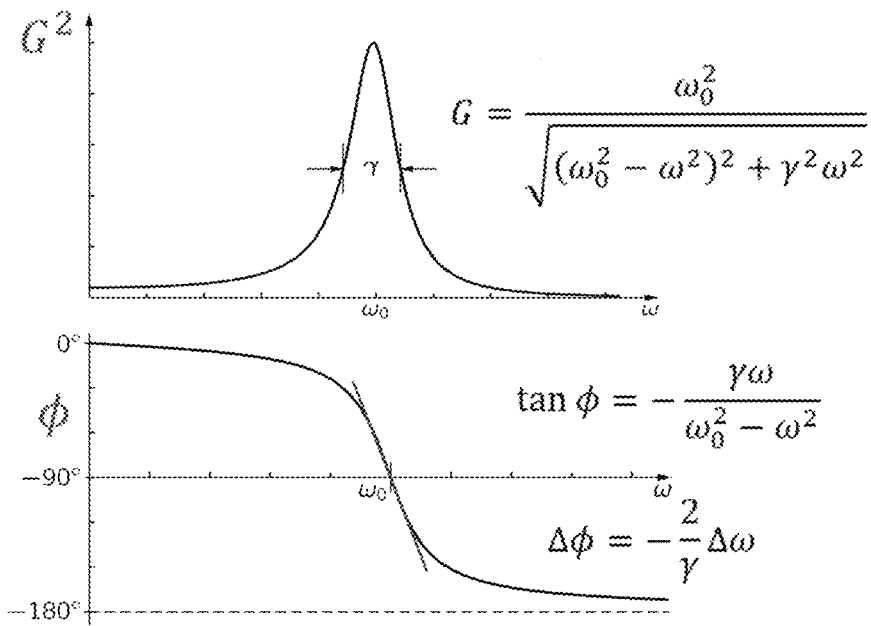
FIG. 3 is a graph showing the narrow bandwidth of the resonance frequency of a high Q-factor prior art MEMS micromirror.
Figure 4:
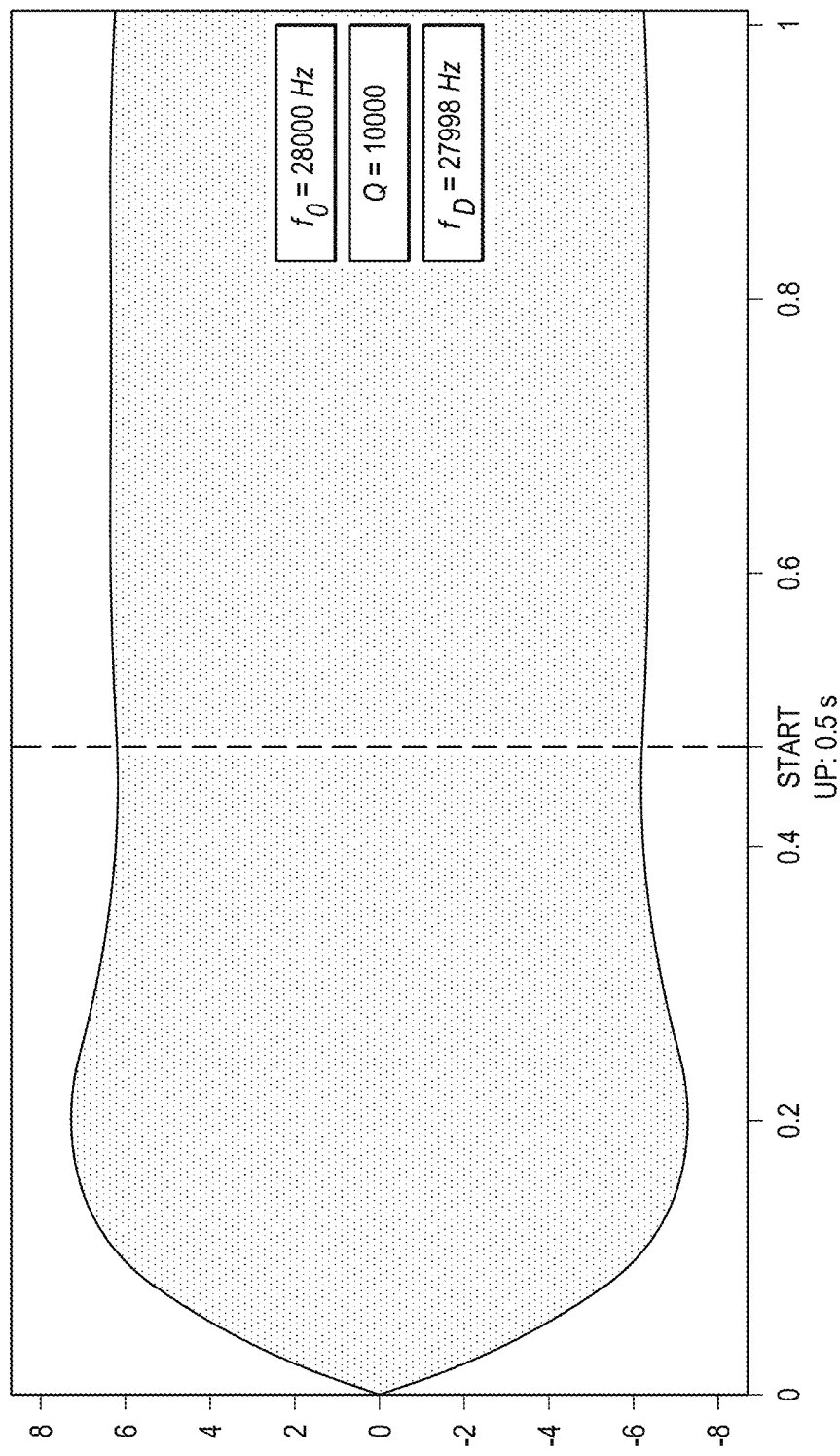
FIG. 4 is a graph of the opening angle of a prior art high Q-factor MEMS micromirror at startup when driven using prior art techniques.
Figure 5:
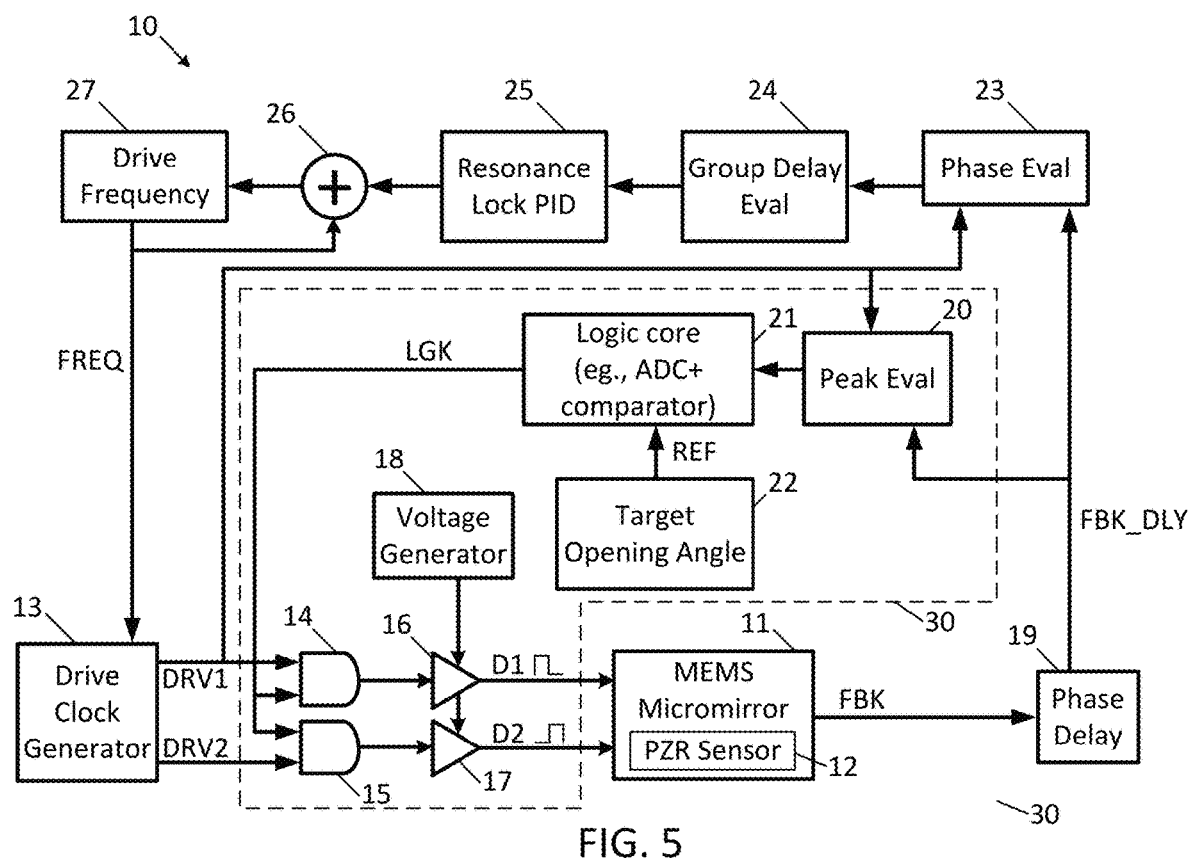
FIG. 5 is a block diagram of a driving circuit disclosed herein including a drive signal modification core.

Now described with reference to FIG. 5 is a driving circuit 10 for a MEMS micromirror 11. The driving circuit 10 includes a drive clock generator 13 receiving a drive frequency control signal FREQ from a drive frequency control signal generator 27, and generating a first drive signal DRV1 and a second drive signal DRV2 therefrom, the second drive signal DRV2 being opposite in phase to the first drive signal DRV1.

A drive signal modification core 30 receives as input the drive signals DRV1 and DRV2, generates therefrom modified drive signals D1 and D2 which are used to drive the MEMS micromirror 11, and generates a feedback signal FBK indicative of the movement of the MEMS micromirror 11 as output. The drive signal modification core 30 will be described below in detail, but first, the remainder of the driving circuit 10 will be described.

A phase delay circuit 19 adds delay to the feedback signal FBK to produce a delayed feedback signal FBK_DLY. A phase evaluation circuit 23 (e.g., a phase frequency detector) compares the phase of the delayed feedback signal FBK_DLY to the phase of the first drive signal DRV1, and outputs the result of the comparison to group delay evaluation circuit 24. The group delay evaluation circuit 24 evaluates the phase delay not only between the phase of the delayed feedback signal FBK_DLY to the phase of the first drive signal DRV1, but taking into account additional phase delay added within the system, in order to generate an output indicative of whether the MEMS micromirror 11 is at resonance. This output is used by the resonance lock proportional-integral-derivative (PID) loop 25 to generate an output that, combined with the drive frequency control signal FREQ as feedback, serves to cause the drive frequency control signal generator 27 to generate the drive frequency control signal FREQ so that it ultimately results in the movement of the MEMS micromirror 11 at resonance. This is accomplished through control of the phase of the drive frequency control signal FREQ.

The drive signal modification core 30 includes AND gates 14 and 15, and buffers 16 and 17 powered by voltage generator 18. The first drive signal DRV1 and a logic signal LGK are logically ANDed together by the AND gate 14, and buffered by buffer 16 (powered by voltage generator 18) to produce a first modified drive signal D1. Similarly, the second drive signal DRV2 and the logic signal LGK are logically ANDed together by the AND gate 15, and buffered by buffer 17 (also powered by voltage generator 18) to produce a second modified drive signal D2. The MEMS micromirror 11 is driven by the first and second modified drive signals D1 and D2. Position sensor 12 (illustratively a piezoresistive position sensor, but any suitable position sensor may be used) generates a feedback signal FBK indicative of the movement of the MEMS micromirror 11.

Figure 5A:
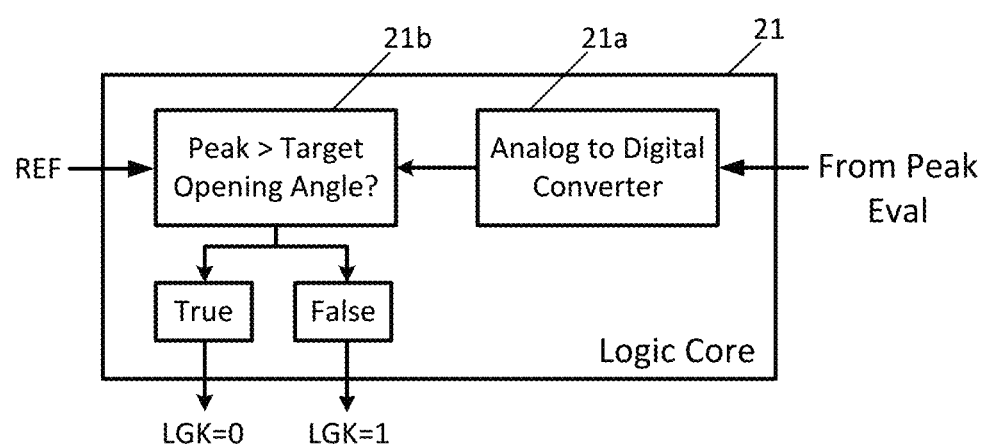
FIG. 5A is a block diagram of the logic core of FIG. 5.

A peak evaluation circuit 20 determines when the peak amplitude value of the delayed feedback signal FBK_DLY has been achieved (e.g., determines the opening angle of the MEMS micromirror 11), and passes it to the logic core 21. Note that the purpose of the peak evaluation circuit 20 is to avoid the logic core 21 operating at high frequency to continually analyze the delayed feedback signal FBK_DLY, instead allowing the logic core 21 to instead analyze the peaks of the delayed feedback signal FBK_DLY without analyzing the delayed feedback signal FBK_DLY at other times. The logic core 21, as shown in FIG. 5A, includes an analog to digital converter 21a that digitizes this peak (e.g., opening angle of the MEMS micromirror 11), and a comparison circuit 21b that compares it to a reference signal REF generated by a target opening angle circuit 22. The reference signal REF is a digital voltage representing the voltage that the delayed feedback signal FBK_DLY would be at when the MEMS micromirror 11 is at its target opening angle.

Therefore, if the digitized peak amplitude value of the delayed feedback signal FBK_DLY is less than the reference signal REF, indicating that the MEMS micromirror 11 has not reached the target opening angle, the logic core 21 asserts its output LGK to a logic high, in turn allowing the drive signals DRV1 and DRV2 to pass through the AND gates 14 and 15. On the other hand, if the digitized peak amplitude value of the delayed feedback signal FBK_DLY is equal to the reference signal REF, indicating that the MEMS micromirror 11 has reached its target opening angle, the logic core 21 de-asserts its output LGK (e.g., pulls it to a logic low), blocking passage of the drive signals DRV1 and DRV2 through the AND gates 14 and 15, having the effect of cutting off the first and second modified drive signals D1 and D2, with the mirror continuing to oscillate but with its opening angle decaying over time.

This is comparison of the delayed feedback signal FBK_DLY is repeated on a cycle-by-cycle basis, such that when the peak of the delayed feedback signal FBK_DLY is at or above the desired peak, the drive signals DRV1 and DRV2 are blocked, and such that when the peak of the delayed feedback signal FBK_DLY is below the desired peak, the drive signals DRV1 and DRV2 are passed to produce the modified drive signals D1 and D2. Note that since the drive signals DRV1 and DRV2 are opposite in phase to one another, in some instances the pulse from but one of them will be permitted to pass by the comparison of the delayed feedback signal FBK_FLY to the reference signal REF. As an alternative the comparison of the delayed feedback signal FBK_DLY may be repeated on a half cycle-by-half cycle basis, such that when the peak of the delayed feedback signal FBK_DLY is at or above a desired positive peak, the drive signals DRV1 and DRV2 are blocked, and such that when the peak of the delayed feedback signal FBK_DLY is at or below a desired negative peak, the drive signals DRV1 and DRV2 are blocked, with the drive signals DRV1 and DR2 otherwise being passed to produce the modified signals D1 and D2.

Thus, the actual driving of the MEMS micromirror 11 is by drive signals D1 and D2 containing "sparse" pulses. By sparse it is meant that instead of the pulses of the signals being of the same width and occurring periodically, as is the case with a conventional drive signal, the pulses of the drive signals D1 and D2 are generated from the drive signals DRV1 and DRV2 only when peak of the delayed feedback signal FBK_DLY is below the desired peak, meaning that different pulses may have different pulse widths, and that any number of pulses may be skipped altogether.

FIG. 6 is a graph showing this operation over time. Note that time T0, the first labeled time point, is some period of time after startup, at which the opening angle of the MEMS micromirror 11 begins to approach the desired opening angle. Keeping that in mind, between times T0 and T1, the output LGK of the logic core 21 is at a logic high. Therefore, the modified drive signals D1 and D2 follow the drive signals DRV1 and DRV2, with each pulse being reproduced. At time T1, however, the peak of the delayed feedback signal FBK_DLY has reached its desired peak (FBK_DLY=REF), so the logic core 21 deasserts its output LGK. Since at time T1, a D1 pulse is currently being generated, LGK going to a logic low causes the AND gate 14 to block DRV1 (e.g., output a logic zero), meaning that D1 is immediately pulled to a logic zero. LGK being logic low also causes the AND gate 15 to block DRV2, with the result being that between time T1 and T2, no D2 pulse is generated, as can be observed. At time T2, the peak of the delayed feedback signal FBK_DLY has fallen below its desired peak (FBK_DLY<REF), and therefore the logic core 21 asserts its output LGK. As a result, at time T2, and AND gate 14 passes DRV1, with the result being that a D1 pulse is generated. However, by time T3, the delayed feedback signal FBK_DLY has reached its desired peak (FBK_DLY=REF) and remains there until T4, resulting in the logic core 21 de-asserting its output LGK, pulling D1 low and blocking a D2 pulse from being generated. At time T4, the delayed feedback signal FBK_DLY has fallen below its desired peak (FBK_DLY<REF) and remains there until T5, meaning that the logic core 21 asserts its output LGK, permitting the generation of a D2 pulse. However, since at T5, the delayed feedback signal FBK_DLY has reached its desired peak (FBK_DLY=REF) and remains there until T6, the logic core 21 again deasserts its output LGK, blocking generation of both D1 and D2 pulses. It is not until D6, as stated, that the delayed feedback signal FBK_DLY has fallen below its desired peak (FBK_DLY=REF), resulting in the logic core 21 again asserting its output LGK, permitting generation of a D2 pulse.

Thus, FIG. 6 it can be observed that the operation of the driving circuit 30 can result in either, or both, of the modified driving signals D1 and D2 being blocked. Note that although not shown in FIG. 6, in some instances, the output LGK of the logic core 21 may be arranged to change the width of the pulses of the drive signals D1 and D2 instead of simply blocking pulses, depending on whether or not the delayed feedback signal FBK_DLY has reached its desired peak (FBK_DLY=REF). It should be understood that, naturally, when fewer pulses of the modified driving signals D1 and D2 are generated, power consumption is reduced.

Figure 7:
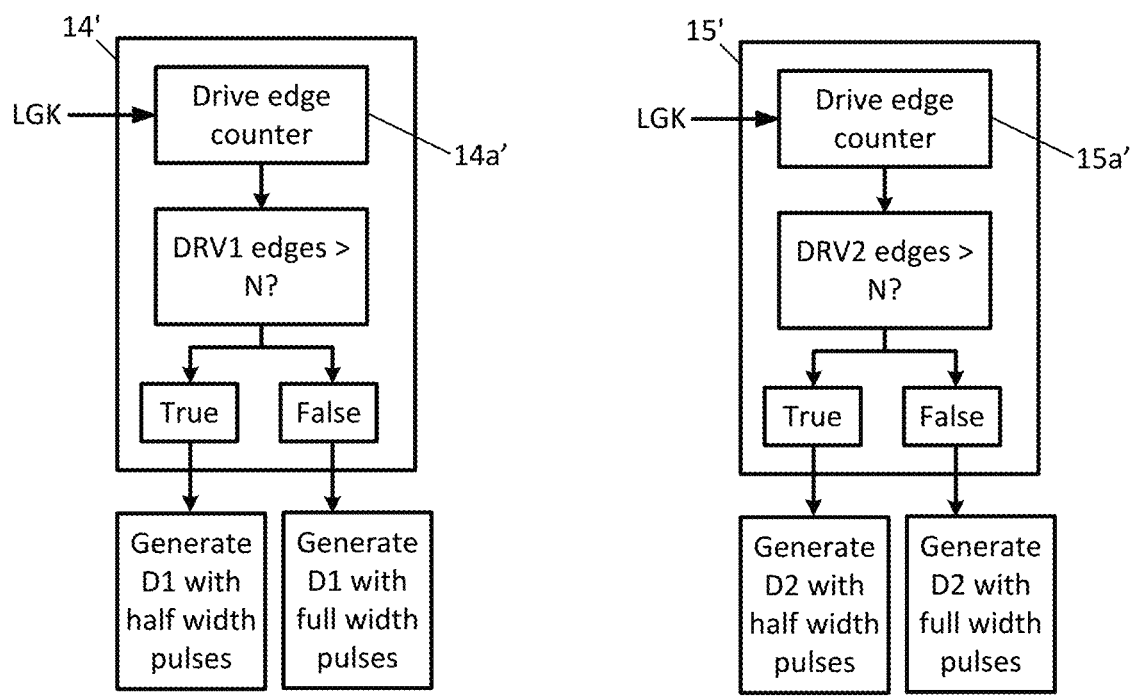
FIG. 7 is a block diagram of the drive logic circuits of FIG. 5.
Figure 8:
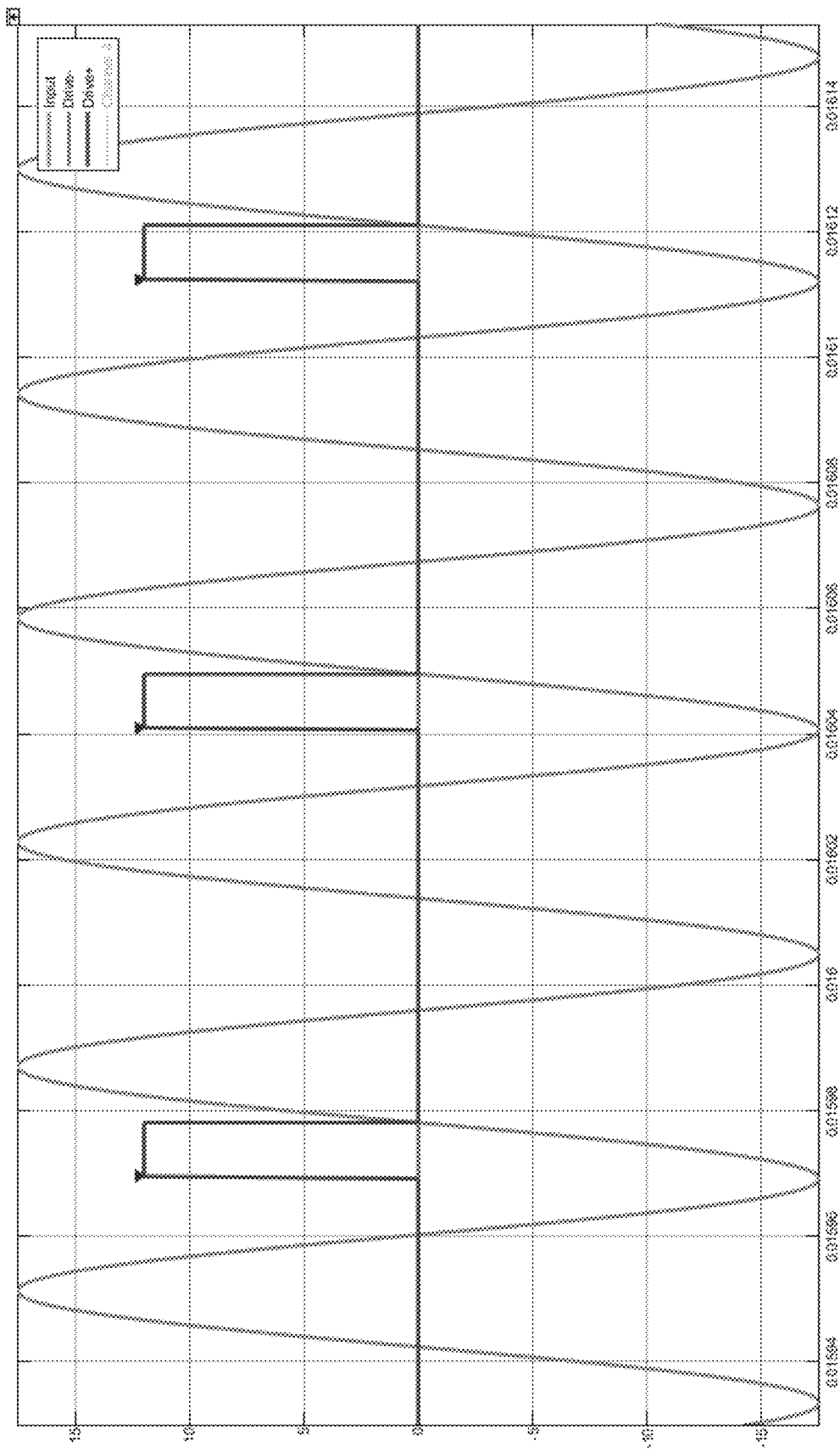
FIG. 8 is a graph of different signals of the driving circuit during operation where the drive logic circuits generate half width modified drive signals.

In this instance, the AND gates 14 and 15 are replaced by logic circuits 14' and 15' that generate either full width pulses of D1 and D2, or half width pulses of D1 and D2. These logic circuits 14' and 15' may be seen in FIG. 7, where it can be observed that they include drive edge counters 14a' and 15a' that receive the output LGK and count the number of drive signal edges between two edges of LGK. Thus, the drive edge counter 14a' counts the number of drive signal DRV1 edges between two edges of LGK, and if the number of edges is greater than a given number N, the modified drive signal D1 is generated as having half width pulses, but is otherwise generated as having full width pulses. Likewise, the drive edge counter 15a' counts the number of drive signal DRV2 edges between two edges of LGK, and if the number of edges is greater than the given number N, the modified drive signal D2 is generated as having half width pulses, but is otherwise generated a shaving full width pulses. The half width pulses so generated can be observed in FIG. 8, where it can be seen that instead of having a pulse width of one half the period of the mirror movement, these pulses have a pulse width of one quarter the period of the mirror movement.

Figure 9:
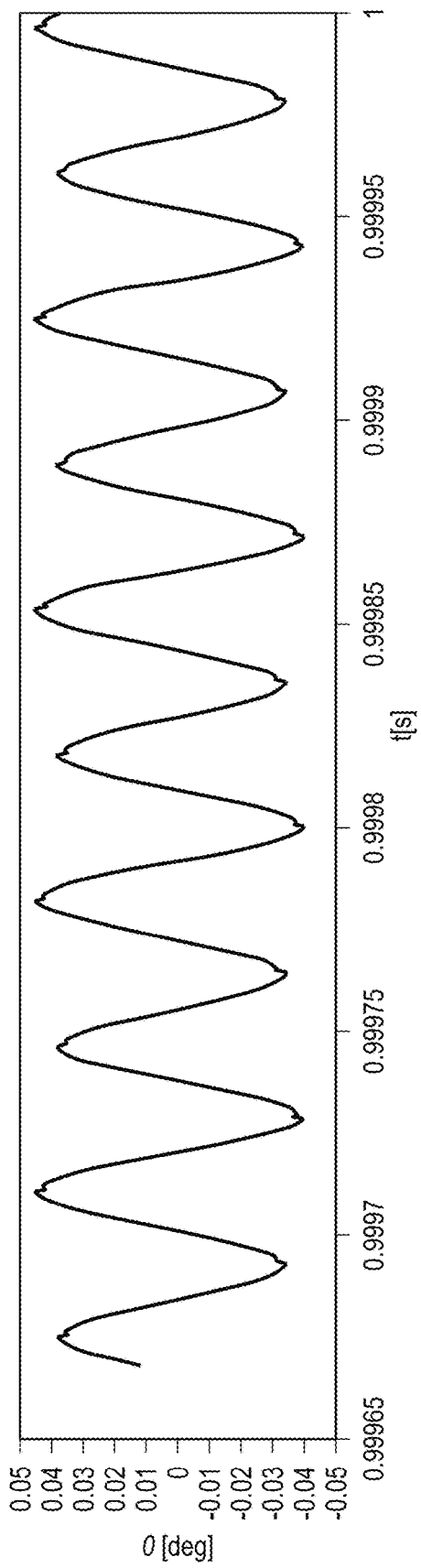
FIGS. 9-10 are a comparison of the opening angle and startup time of a same MEMS micromirror without and with the use of the drive signal modification core of FIG. 5.
Figure 10:
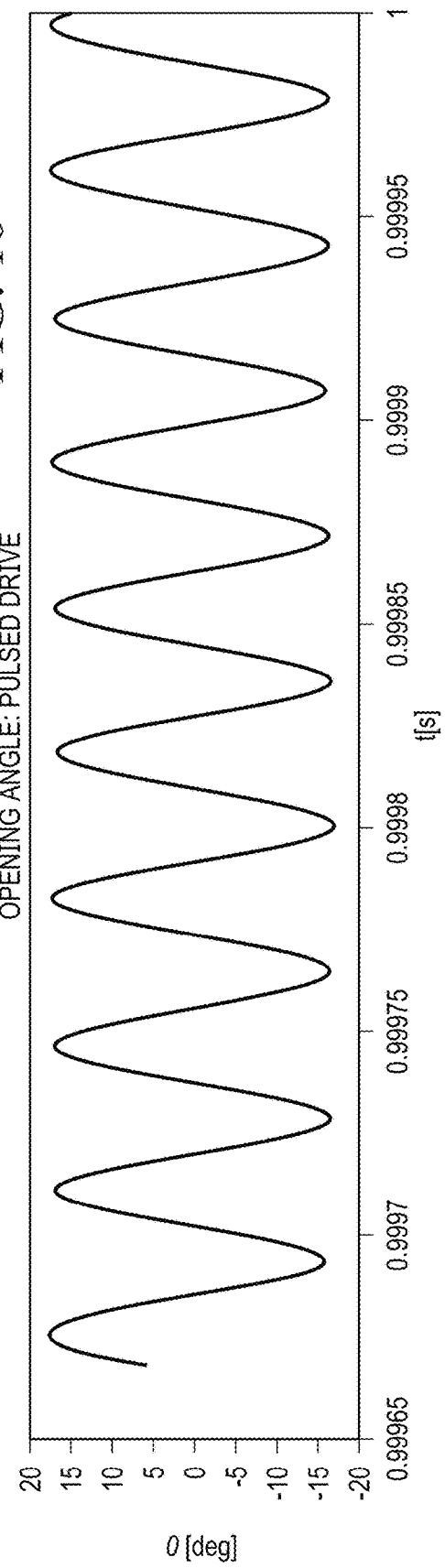

A comparison of the amplitude and startup time of the same MEMS micromirror 11 when driven using just the phase based control of the driving circuit 10 without the amplitude based control of the drive signal modification core 30 (FIG. 9) as compared to when driven using the amplitude based control of the drive signal modification core 30 (FIG. 10) helps illustrate the advantages provided by the drive signal modification core 30. In this example, the target amplitude of the movement of the MEMS micromirror 11 is 30° (e.g., oscillating between ±15°), at a target frequency of 28 KHz, with a Q-factor of 10,000. Note that without the drive signal modification core 30, the startup time is greater than 200 ms, as shown in FIG. 9, but with the drive signal modification core 30, the startup time is less than 50 ms as shown in FIG. 10. Note that the amplitude of the drive signals D1 and D2 is higher when using the drive signal modification core 30, for example shown here as 5V, as compared to a lower amplitude without using drive signal modification core 30, shown here at 1.7V, the drive signals in both examples being at 27.999 KHz (~28 KHz). Do note that the startup time can be decreased by increasing the drive voltage. For example, to reduce startup time from around 50 ms to 10 ms, the drive voltage may be increased from 5V to 20V.

The quick startup time provided by the drive signal modification core 30 is particularly desirable for applications where the MEMS micromirror 11 does not run constantly, but is started and stopped numerous times during operation. One such example is mixed reality glasses, where at certain times, the MEMS micromirror 11 is started so as to display information to a user, but otherwise is stopped to provide the user with an uninterrupted view out through the glasses.

It should be appreciated that the drive signal modification core 30 is agnostic to mechanical parameters of the MEMS micromirror 11, eliminating or substantially reducing the need to carefully and specifically match the drive signals DRV1 and DRV2 to the specific properties of the MEMS micromirror 11. With prior art designs, a calibration or trimming performed on the driving circuit 10 may be necessary for each unit products to account for process variation between batches of MEMS micromirrors, however this is eliminated by the drive signal modification core 30 as it achieves the desired amplitude or opening angle regardless of whether the drive signals DRV1 and DRV2 and driving circuit 10 are precisely matched to the specific properties of the MEMS micromirror 11. Moreover, particularly careful control of the amplitude and frequency of the drive signals DRV1 and DRV2 is also not needed due to the drive signal modification core 30.

Figure 11:
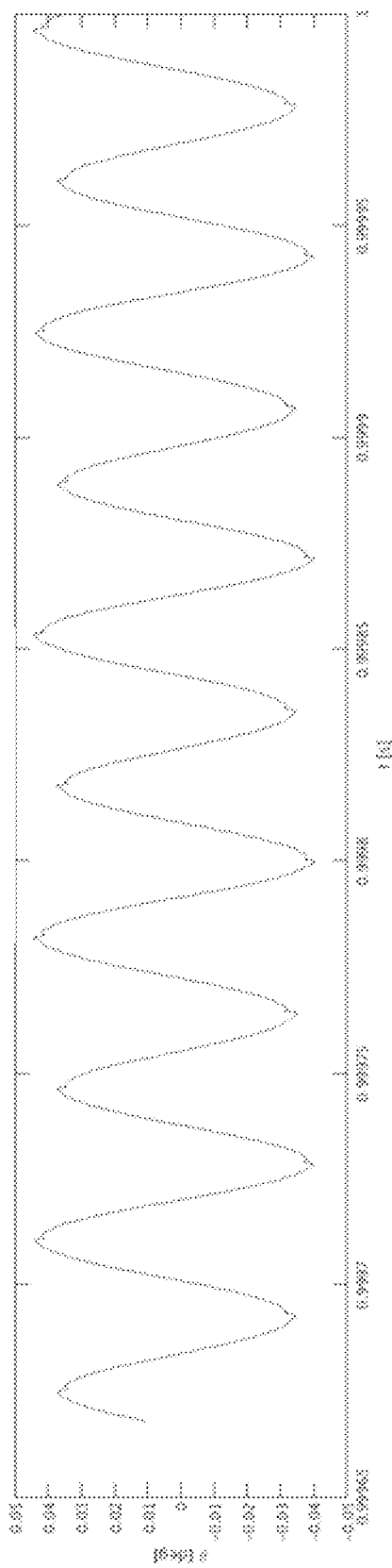
FIGS. 11-12 are graphs showing the error on the opening angle of the MEMS micromirror when driven without the amplitude based control of the drive signal modification core described herein as compared to when driven using the amplitude based control of the drive signal modification core.
Figure 12:
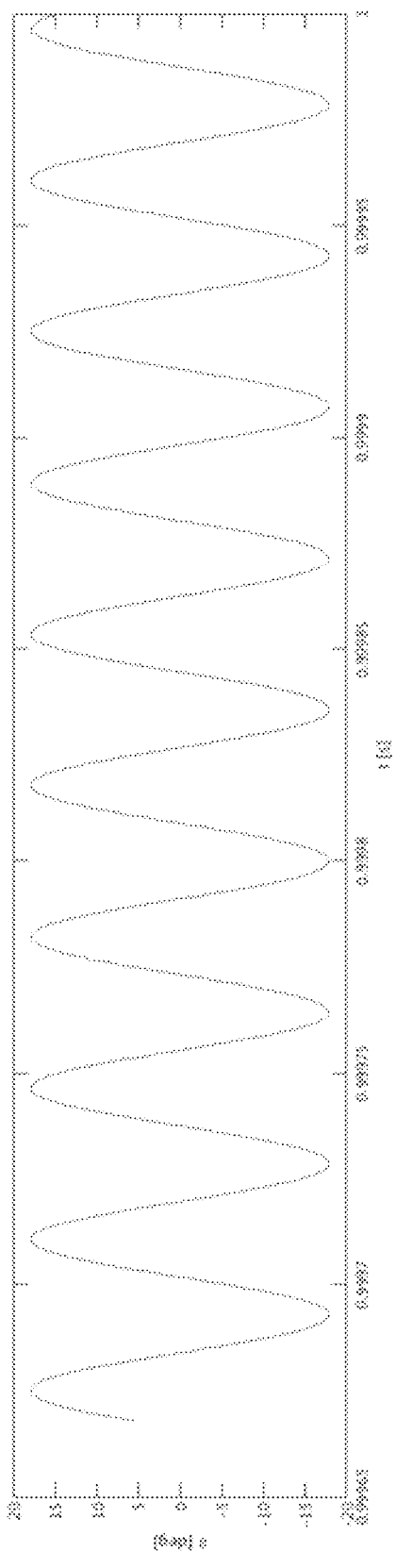

Shown in FIGS. 11-12 are graphs showing the error on the opening angle of the MEMS micromirror 11 when driven using just the phase based control of the driving circuit 10 without the amplitude based control of the drive signal modification core 30 (FIG. 11) as compared to when driven using the amplitude based control of the drive signal modification core 30 (FIG. 12). It is shown that using the amplitude based control of the drive signal modification core 30, the trajectory of the MEMS micromirror 11 is unaffected, although amplitude error does occur. This amplitude error, however, can be easily eliminated by compensation. Thus, accuracy is not degraded using the amplitude based control of the drive signal modification core.

Figure 13:
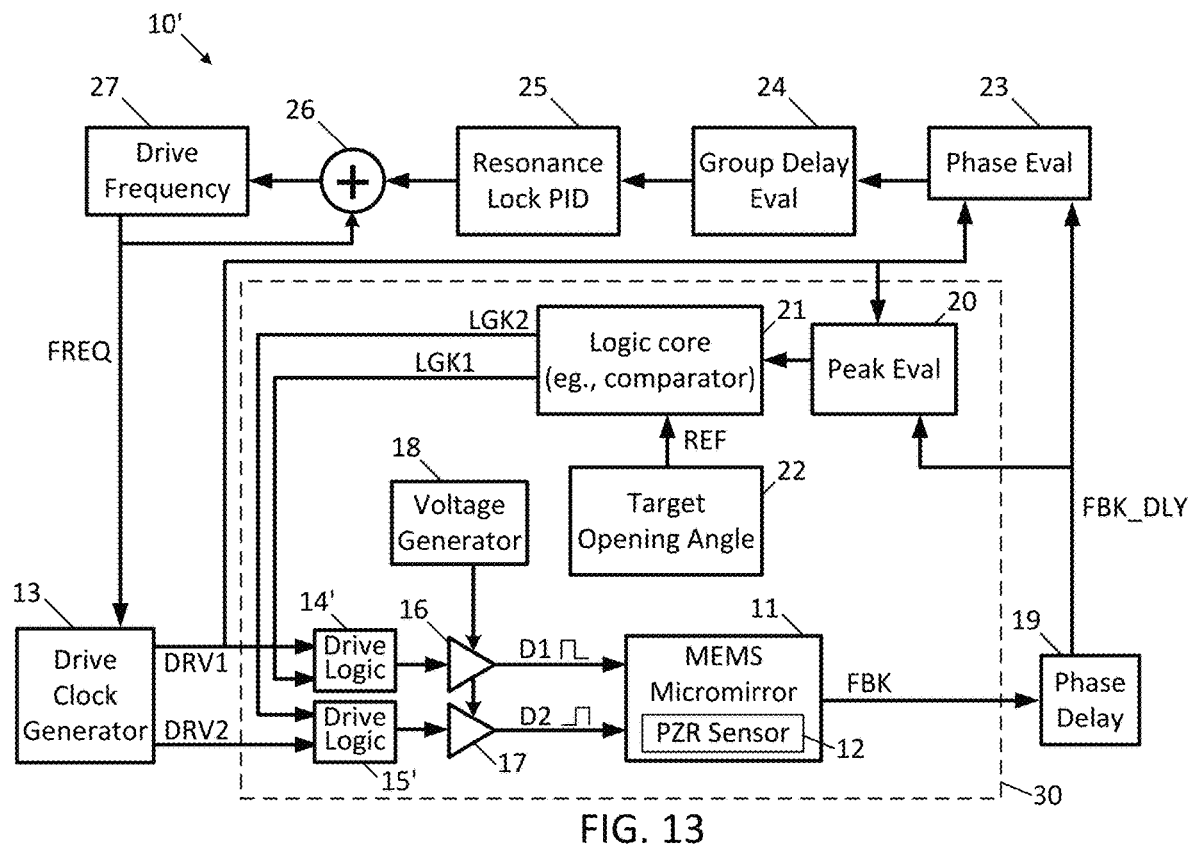
FIG. 13 is a block diagram of another embodiment of a driving circuit disclosed herein including a drive signal modification core.

A variant of the drive signal modification core 30' is shown in FIG. 13. Note here that instead of AND gates, drive logic circuits 14' and 15' respectively receive the drive signals DRV1 and DRV2 from the drive clock generator 13. In addition, the drive logic circuits 14' and 15' also receive first and second logic signals LGK1 and LGK2 from the logic core 21. This variant 30' may operate exactly as the drive signal modification core 30 of FIG. 5 if desired. However, this variant 30' may also, dependent upon the peak of the delayed feedback signal FBK_DLY, generate the modified drive signals D1 and D2 with inverted phases to thereby provide a pulse train that rapidly stops movement of the MEMS micromirror 11, or that rapidly brings the amplitude of the MEMS micromirror 11 back below a desired threshold.

Figure 14:
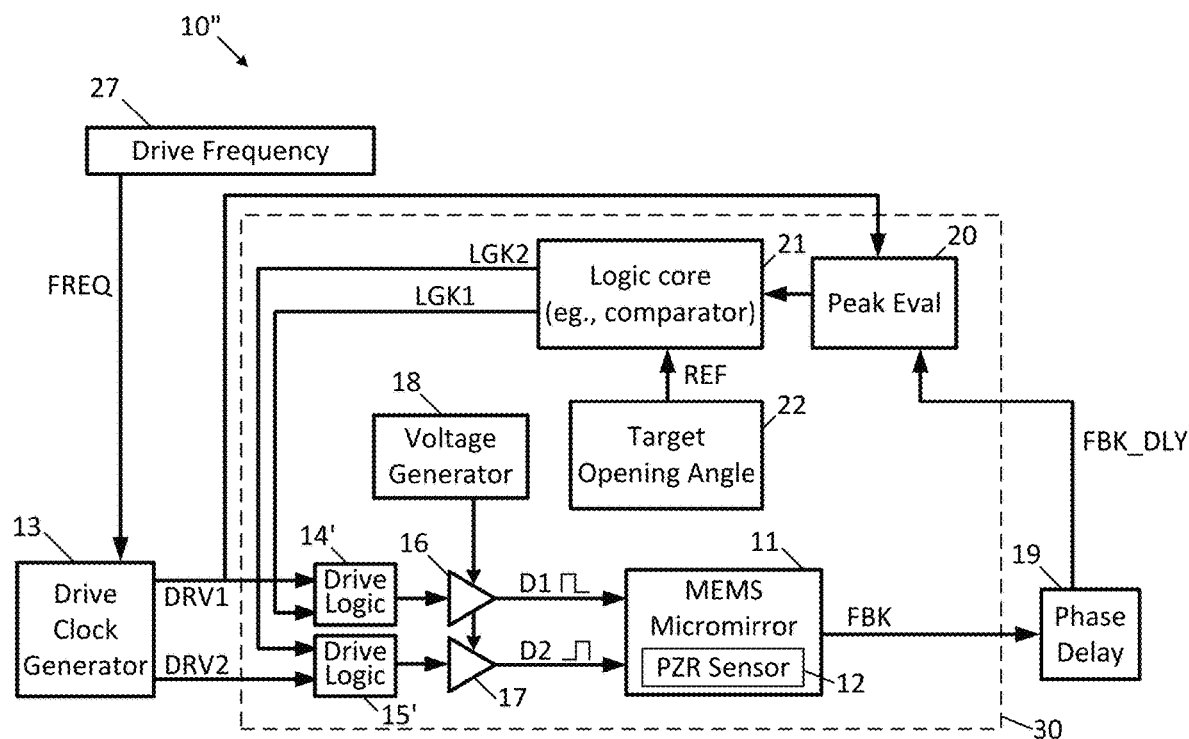
FIG. 14 is a block diagram of a further embodiment of a driving circuit disclosed herein including a drive signal modification core with lock on resonance embedded inside the drive signal modification core.

In some instances, the use of the drive signal modification core 30 or 30' may eliminate the portions of the drive circuitry 10 used to provide phase based control. Such an example of the drive circuitry 10" is shown in FIG. 14, where it can be observed that the drive frequency generation circuitry 27 does not receive feedback. Instead, the desired opening angle (e.g., amplitude) can be achieved solely through the amplitude based modification provided by the drive signal modification core 30".

Note that although the above has been described with respect to the operation of a MEMS micromirror, the drive signal modification cores 30, 30', and 30" described herein may be used with any MEMS devices, such as gyroscopes or lenses that are operated at resonance using MEMS technology.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A control circuit for a micro-electromechanical systems (MEMS) device, the control circuit comprising:
    an input logic circuit configured to receive at least one MEMS drive signal and a control signal, and cause generation of at least one modified drive signal based thereupon, the at least one modified drive signal being used to drive the MEMS device; and
    logic circuitry configured to:
        receive a feedback signal from the MEMS device, and indicate when the feedback signal is at its peak value, the feedback signal being indicative of movement of the MEMS device; and
        based upon the indication of when the feedback signal is at its peak value, generate the control signal based upon whether the peak value is at least equal to a desired peak value, the desired peak value being indicative of the movement of the MEMS device reaching a desired amplitude;
    wherein the input logic circuit is configured to modify the at least one MEMS drive signal when the feedback signal is at least equal to the desired peak value to produce the at least one modified drive signal, the modification to the at least one MEMS drive signal rendering the at least one modified drive signal as having a variable frequency and/or duty cycle dependent upon the control signal.

2. The control circuit of claim 1, wherein the logic circuitry comprises an analog to digital converter that digitizes the feedback signal when the logic circuitry indicates that the feedback signal is at its peak value, and a comparator that compares the digitized feedback signal to the desired peak value to generate the control signal.

3. The control circuit of claim 2, wherein the comparator asserts its output when the digitized feedback signal is less than the desired peak value, and deasserts its output otherwise; and wherein the input logic circuit comprises at least one AND gate receiving as input the control signal and the at least one MEMS drive signal, the at least one AND gate generating the at least one modified drive signal as a result of a logical AND operation performed on the control signal and the at least one MEMS drive signal.

4. The control circuit of claim 3, further comprising a buffer coupled between output of the at least one AND gate and the MEMS device.

5. The control circuit of claim 2, wherein the comparator asserts its output when the digitized feedback signal is less than the desired peak value, and deasserts its output otherwise; wherein the at least one MEMS drive signal comprises first and second MEMS drive signals opposite in phase to one another; wherein the at least one modified drive signal comprises first and second modified drive signals used to drive the MEMS device; and
    wherein the input logic circuit comprises:
        a first AND gate receiving as input the control signal and the first MEMS drive signal, the first AND gate generating the first modified drive signal as a result of a logical AND operation performed on the control signal and the first MEMS drive signal; and
        a second AND gate receiving as input the control signal and the second MEMS drive signal, the second AND gate generating the second modified drive signal as a result of a logical AND operation performed on the control signal and the second MEMS drive signal.

6. The control circuit of claim 5, further comprising a first buffer coupled between output of the first AND gate and the MEMS device, and a second buffer coupled between output of the second AND gate and the MEMS device.

7. The control circuit of claim 1, further comprising a drive frequency generator configured to generate a drive frequency signal, and a drive clock generator configured to generate the at least one MEMS drive signal based upon the drive frequency signal.

8. The control circuit of claim 7, further comprising:
    a phase delay circuit configured to receive the feedback signal, and apply a phase delay to the feedback signal;
    a phase evaluation circuit configured to receive the feedback signal after application of the phase delay thereto by the phase delay circuit, to receive the at least one MEMS drive signal, and to generate a phase evaluation signal indicative of whether the feedback signal leads or lags the at least one MEMS drive signal;
    a group delay evaluation circuit configured to receive the phase evaluation signal, to determine, taking into account system phase delay, whether the MEMS device is operating at resonance, and to generate an output signal based upon the determination; and
    a resonance proportional-integral-derivative loop configured to operate based upon the output signal from the group delay evaluation circuit to generate a drive frequency input;
    wherein the drive clock generator is configured to generate the drive frequency signal based upon the drive frequency input.

9. The control circuit of claim 1, wherein the input logic circuit modifies the at least one MEMS drive signal when the feedback signal is at least equal to the desired peak value by blocking generation of the at least one modified drive signal until the feedback signal is less than the desired peak value.

10. The control circuit of claim 1, wherein the input logic circuit modifies the at least one MEMS drive signal when the feedback signal is at least equal to the desired peak value by shortening a pulse width if the at least one modified drive signal until the feedback signal is less than the desired peak value.

11. The control circuit of claim 1, wherein the MEMS device comprises a MEMS micromirror driven by the at least one modified drive signal, and a position sensor associated with the MEMS micromirror and generating the feedback signal.

12. The control circuit of claim 1, wherein the input logic circuit modifies the at least one drive signal by inverting the at least one drive signal when the feedback signal is at least equal to the desired peak value.

13. The control circuit of claim 1, wherein the logic circuitry comprises:
- a peak evaluation circuit configured to receive the feedback signal from the MEMS device, and to indicate when the feedback signal is at its peak value, the feedback signal being indicative of movement of the MEMS device; and
- a logic core configured to receive the indication from the peak evaluation circuit of when the feedback signal is at its peak value, and generate the control signal based upon whether the peak value is at least equal to a desired peak value, the desired peak value being indicative of the movement of the MEMS device reaching a desired amplitude.

14. A method of operating a MEMS device, comprising:

generating at least one MEMS drive signal;

modifying the at least one MEMS drive signal based upon a control signal to produce at least one modified drive signal; and generating the control signal by determining when a feedback signal from the MEMS device is at its peak value, comparing the peak value to a desired value when the feedback signal is as its peak, and generating the control signal depending upon whether the peak value is at least equal to a desired value;

wherein the modification of the at least one MEMS drive signal based upon the control signal to produce the at least one modified drive signal comprises skipping generation of a next pulse of the at least one modified drive signal when the control signal indicates the peak value is at least equal to the desired value.

15. The method of claim 14, wherein the control signal is asserted when the peak value is at least equal to a desired value; and wherein the modification of the at least one MEMS drive signal is accomplished by performing a logical AND operation between the control signal and the at least one MEMS drive signal.

16. The method of claim 14, wherein the at least one modified drive signal is generated by, at least some of the time, inverting the at least one drive signal when the feedback signal is at least equal to the desired value.

* * * * *